(12) United States Patent
Mizukoshi

(10) Patent No.: US 8,154,070 B2
(45) Date of Patent: Apr. 10, 2012

(54) SEMICONDUCTOR MEMORY DEVICE AND METHOD OF MANUFACTURING THE SAME

(75) Inventor: Toshikazu Mizukoshi, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 551 days.

(21) Appl. No.: 11/987,845

(22) Filed: Dec. 5, 2007

(65) Prior Publication Data

US 2008/0157168 A1 Jul. 3, 2008

(30) Foreign Application Priority Data

Dec. 27, 2006 (JP) ................... 2006-352248

(51) Int. Cl.
*H01L 29/788* (2006.01)
*H01L 29/792* (2006.01)
(52) U.S. Cl. ........ 257/316; 257/314; 257/315; 257/324; 257/E29.3; 257/E29.309
(58) Field of Classification Search .......... 257/314–316, 257/324, E29.3, E29.309
See application file for complete search history.

(56) References Cited

U.S. PATENT DOCUMENTS

2005/0190605 A1* 9/2005 Miida .................. 365/185.24

FOREIGN PATENT DOCUMENTS

| JP | H05-343674 A | 12/1993 |
| JP | 3630491 B1 | 9/1997 |
| JP | 2002-184873 A | 6/2002 |
| JP | 2004-186663 A | 7/2004 |
| JP | 2005-064295 A | 3/2005 |

* cited by examiner

*Primary Examiner* — Anh Phung
*Assistant Examiner* — Allison P Bernstein
(74) *Attorney, Agent, or Firm* — Rabin & Berdo, P.C.

(57) ABSTRACT

A nonvolatile memory includes a semiconductor substrate having a body member and a step member formed on the body member, a highly doped first well layer formed on the step member, a control electrode formed on the step member, a first and a second diffusion layers in the substrate, lightly doped second well layers formed on the main surface of the substrate between the first or the second diffusion layer and the first well layer, and a first and a second charge-storage multi-layers sandwiching the step member and the control electrode, each of the first and the second charge-storage multi-layers including a bottom oxide layer, a charge-storage film, a top oxide layer and a floating electrode which are formed in that order.

9 Claims, 9 Drawing Sheets

SEMICONDUCTOR MEMORY DEVICE AND METHOD OF MANUFACTURING THE SAME

CROSS-REFERENCE TO RELATED APPLICATION

This application claims the priority benefit of Japanese Patent Application No. 2006-352248, filed Dec. 27, 2006, the entire disclosure of which is incorporated herein by reference.

BACKGROUND OF THE INVENTION

1. Field of the Invention

The invention relates to a semiconductor memory device, specifically, relates to a rewritable nonvolatile memory device having a SONOS (Silicon-Oxide-Nitride-Oxide-Silicon) structure, such as a flash memory.

2. Description of the Related Art

One of the most well-known rewritable nonvolatile semiconductor memories is a flash memory having a SONOS structure. Such a flash memory having the SONOS is disclosed in Japanese Patent Publication Reference 2006-184873A.

A flash memory having a SONOS structure disclosed in Japanese Patent Publication Reference 2006-184873A is explained as follows with reference to FIG. 5. FIG. 5 is a cross-sectional view of the conventional single nonvolatile semiconductor memory. As shown in FIG. 5, a memory 110 having the SONOS structure includes a bottom oxide layer 142, a charge-storage film 144 and a top oxide layer 146, which are formed in that order on a silicon substrate 120 at an active region, which is defined by the isolation regions. The bottom oxide layer 142 is also called a tunnel oxide layer, and the top oxide layer 146 is also called a blocking oxide layer.

The memory 110 further includes a gate electrode 138 on the top oxide layer 146. A first and a second diffusion layers 128a and 128b are formed at the surface of the silicon substrate 120 wherein a channel region formed under the gate electrode 138 is sandwiched by the first and the second diffusion layers 128a and 128b. The first and the second diffusion layers 128a and 128b act as a source and a drain or a drain and a source. In the following explanation, the first diffusion layer 128a acts as the drain, and the second diffusion layer 128b acts as the source. Thus, in some occasions, the reference 128a is referred as the drain, and in other occasions, the reference 128a is referred as the first diffusion layer. As well, in some occasions, the reference 128b is referred as the source, and in other occasions, the reference 128b is referred as the second diffusion layer.

The injection of electrons into the charge-storage film 144 is made by applying the ground potential to the source 128b and the silicon substrate 120, and by applying the positive potential to the gate electrode 138 and the drain 128a. Under this condition, hot electrons having a high energy state are generated from the electrons ran in the channel of the silicon substrate 120 under the gate electrode 138 by a strong electric field in the horizontal direction at an area adjacent to the drain 128a. The hot electrons are injected into the charge-storage film 144 by an electric field generated between the gate electrode 138 and the silicon substrate 120.

A condition of the memory 110 is identified by the following states; the state that the electrons are stored in the charge-storage film 144 is indicated as "1", and the state that the electrons are not stored in the charge-storage film 144 is indicated as "0"

The charge-storage film 144 induces the positive charges at an area of the silicon substrate 120, which is underneath the charge-storage film 144. As a result, the channel resistance increases. Therefore, when the electrons are injected into the charge-storage film 144, the channel current value gets smaller because the channel resistance increases, compared with the condition that the electrons are not injected into the charge-storage film 144. Accordingly, by measuring the size of the channel current value, the condition of the memory 110 whether or not the charge-storage film 144 stores the electrons can be identified.

The size of the channel current value at the time of reading-out the data is determined by the resistance of the source 128b, that is, a condition whether or not the electrons are stored in the charge-storage film 144 at its certain area which is adjacent to the source 128b. Since the charge-storage film 144 can store the electrons locally, it is possible to store the electrons in the charge-storage film 144 either at the source side or at the drain side or both at the source and drain sides. In the memory 110 having the SONOS structure, 2-bit information can be stored in the single memory cell by changing the function of the first diffusion layer 128a from the drain to the source.

However, shorter the gate length of the MOSFET is, shorter the distance between the areas in the charge-storage film 144 of the memory 110 where the electric charges are sorted is. Under this condition, it is hard to store 2-bit information in the single charge-storage film because these two areas cause interference to each other.

To solve this problem, a side-wall type nonvolatile semiconductor memory whose charge-storage layers are formed at the both sides of the gate electrode is proposed. Such a side-wall type memory is referred in Japanese Patent Publication Reference 2005-64295A.

A side-wall type memory disclosed in Japanese Patent Publication Reference 2005-64295A is explained as follows with reference to FIG. 6. FIG. 6 is a cross-sectional view of the conventional single side-wall type memory 210. The side-wall type memory 210 includes a MOS Field Effect Transistor (MOSFET) formed on a silicon substrate 220. The MOSFET includes a gate electrode 238, a first and a second diffusion layers 228a and 228b, and a first and a second resistance changeable layers 227a and 227b.

The gate electrode is formed on the silicon substrate 220 via a gate oxide layer 236. The first and the second diffusion layers 228a and 228b whose N-type impurities are doped are formed at the surface of the silicon substrate 220 wherein a channel region formed under the gate electrode 238 is sandwiched by the first and the second diffusion layers 228a and 228b. The first and the second diffusion layers 228a and 228b act as a source and a drain or a drain and a source. In the following explanation, the first diffusion layer 228a acts as the drain, and the second diffusion layer 228b acts as the source. Thus, in some occasions, the reference 228a is referred as the drain, and in other occasions, the reference 228a is referred as the first diffusion layer. As well, in some occasions, the reference 228b is referred as the source, and in other occasions, the reference 228b is referred as the second diffusion layer.

The first resistance changeable layer 227a is formed between the first diffusion layer 228a and a channel region 220a, which is formed under the gate electrode 238, and the second resistance changeable layer 227b is formed between the second diffusion layer 228b and the channel region 220a. In both of the first and the second resistance changeable layers 227a and 227b, although N-type impurities, which is the same conductivity type doped in the first and the second diffusion layer 228a and 228b, are doped, the concentration of the impurities' in the first and the second resistance changeable layers 227a and 227b is lighter than that in the first and the second diffusion layer 228a and 228b.

The side-wall type memory 210 includes a first charge-storage layer 240a formed on the first resistance changeable layer 227a and a second charge-storage layer 240b formed on the second resistance changeable layer 227b. The first charge-storage multi-layer 240a, which is a structure storable electric charges, includes a bottom oxide layer 242a, a charge-storage film 244a, and a top oxide layer 246a, which are formed in that order. The second charge-storage multi-layer 240b, which is a structure storable electric charges, includes a bottom oxide layer 242b, a charge-storage film 244b, and a top oxide layer 246b, which are formed in that order.

According to the side-wall type memory 210, the resistance value of each of the first and the second resistance changeable layers 227a and 227b are changed by the condition whether or not the electric charges are stored in one of, both of or none of the first and the second charge-storage multi-layers 240a and 240b.

A condition of the memory 210 is identified by the following states; the state that the electrons are stored in the charge-storage multi-layer is indicated as "1", and the state that the electrons are not stored in the charge-storage multi-layer is indicated as "0"

For example, in order to inject the electrons into the first charge-storage multi-layers 240a, the positive voltage is applied to the gate electrode 238 and to the drain 228a while the source 228b and the silicon substrate 220 are grounded. Under this state, the electrons, which run through the channel, become a high energy condition called "hot electrons" at an area adjacent to the drain 228a by a strong electric field toward the drain 228a. These hot electrons are injected into the first charge-storage multi-layers 240a by an electric field toward the gate electrode 238.

In order to read-out the information at the first charge-storage multi-layers 240a, the positive voltage is applied to the gate electrode 238 and to the source 228b while the drain 228a and the silicon substrate 220 are grounded.

When the electrons are stored in the first charge-storage multi-layers 240a, the electrons stored in the first charge-storage multi-layers 240a induces positive charges in the first resistance changeable layer 227a underneath the first charge-storage multi-layers 240a. The resistance value of the first resistance changeable layer 227a underneath the first charge-storage multi-layers 240a is increased by the induced positive charges so that an electric current between the source and the drain (called "channel current") is decreased. On the other hand, when the electrons are not stored in the first charge-storage multi-layers 240a, since the resistance value of the first resistance changeable layer 227a is not increased, the channel current is not decreased. By measuring the channel current, it is judged whether or not the electrons are stored in the first charge-storage multi-layers 240a, that is, whether the first charge-storage multi-layers 240a has data "1" or data "0".

As well as the memory 110 in FIG. 110, in the side-wall type memory 210, two-bit information can be stored in the single memory cell by changing the function of the first diffusion layer 228a from the drain to the source.

However, according to the side-wall type memory 210 disclosed in Japanese Patent Publication Reference 2005-64295A, it is getting difficult to secure the sufficient width for the side wall when the size of the memory cell is shrunken. When the sufficient width for the side wall is not secured enough, the memory cell may have influence of a possible short-channel effect In response to this demand, some technologies disclosed in Japanese Patent Publication Reference 2004-186663A and Japanese Patent Publication Reference H05-343674A have been proposed. According to these references, the charge-storage layer is located under the surface of the gate oxide layer and the silicon substrate partially. Under the structure of the memory cell disclosed in these references, the substantial channel length can be secured in the vertical direction in the silicon substrate even if the size of the memory cell area is shrunken. Furthermore, in Japanese Patent Reference 3630491 B1, it is disclosed that by forming a poly-silicon electrode on a charge-storage layer, the electric charges are stored in the charge-storage layer by the using its junction capacitance.

However, according to the semiconductor device disclosed in Japanese Patent Publication Reference 2004-186663A and Japanese Patent Publication Reference H05-343674A, a sufficient electric field may not be generated in an area of the silicon substrate, which faces to the charge-storage layer so that a sufficient channel current is hard to obtain. As a result, the judgment for the condition whether the charge-storage layer has data "1" or data "0" may be difficult to make.

SUMMARY OF THE INVENTION

An objective of the invention is to solve the above-described problem and to provide a nonvolatile semiconductor memory, which can generate the sufficient electric field at an area of the silicon substrate facing to the charge-storage multi-layer by using the junction capacitance, and which can obtain the sufficient channel current by decreasing the threshold voltage at the area of the silicon substrate.

The objective is achieved by a nonvolatile semiconductor memory including a semiconductor substrate having a step member formed on its main surface, the step member having an upper surface, a first well layer having a first conductive type formed on the supper surface of the step member, a control electrode formed on the step member via a gate oxide layer, which is formed on the first well layer, a first and a second diffusion layers each having a second conductive type, which is different from the first conductive type, the first and the second diffusion layers being formed on the main surface of the semiconductor substrate in areas, which are located at both sides of an area where the step member is formed, second well layers each having the first conductivity type, one of the second well layers being formed on the main surface of the semiconductor substrate between the first diffusion layer and the first well layer, and the other second well layer being formed on the main surface of the semiconductor substrate between the second diffusion layer and the first well layer, wherein the concentration of the first conductivity type in either the second well layers is lighter than that in the first well layer and a first and a second charge-storage multi-layers sandwiching the step member and the control electrode, each of the first and the second charge-storage multi-layers including a bottom oxide layer, a charge-storage film formed on the bottom oxide layer, a top oxide layer formed on the charge-storage film and a floating electrode formed on the top oxide layer.

BRIEF DESCRIPTION OF THE DRAWINGS

The invention will be more particularly described with reference to the accompanying drawings, in which.

DETAILED DESCRIPTION OF THE PREFERRED EMBODIMENTS

The preferred embodiment of the invention is explained together with drawings as follows. In each drawing, the same reference numbers designate the same or similar components.

The Preferred Embodiment

[A Semiconductor Memory Device]

Figure 1A:
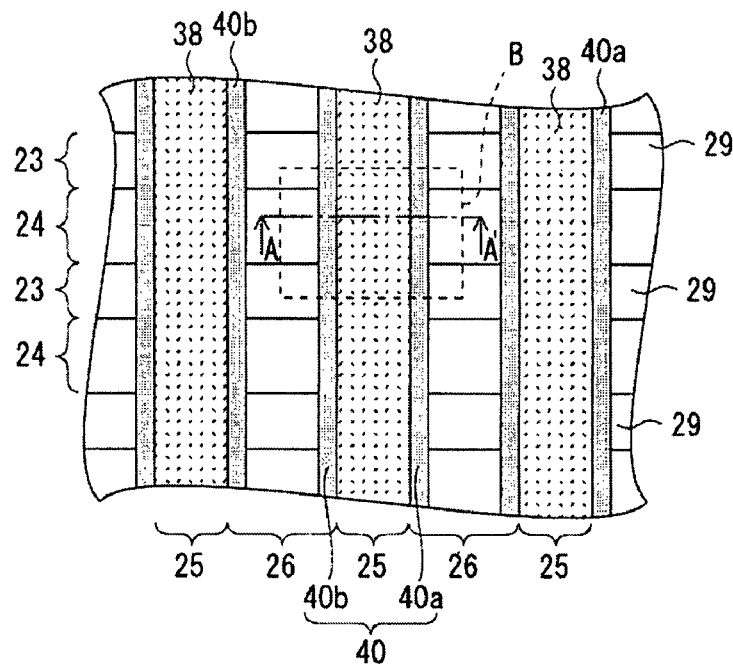
FIG. 1A is a partial plan view of a nonvolatile semiconductor memory device having memory cells in a matrix, according to a preferred embodiment.
Figure 1B:
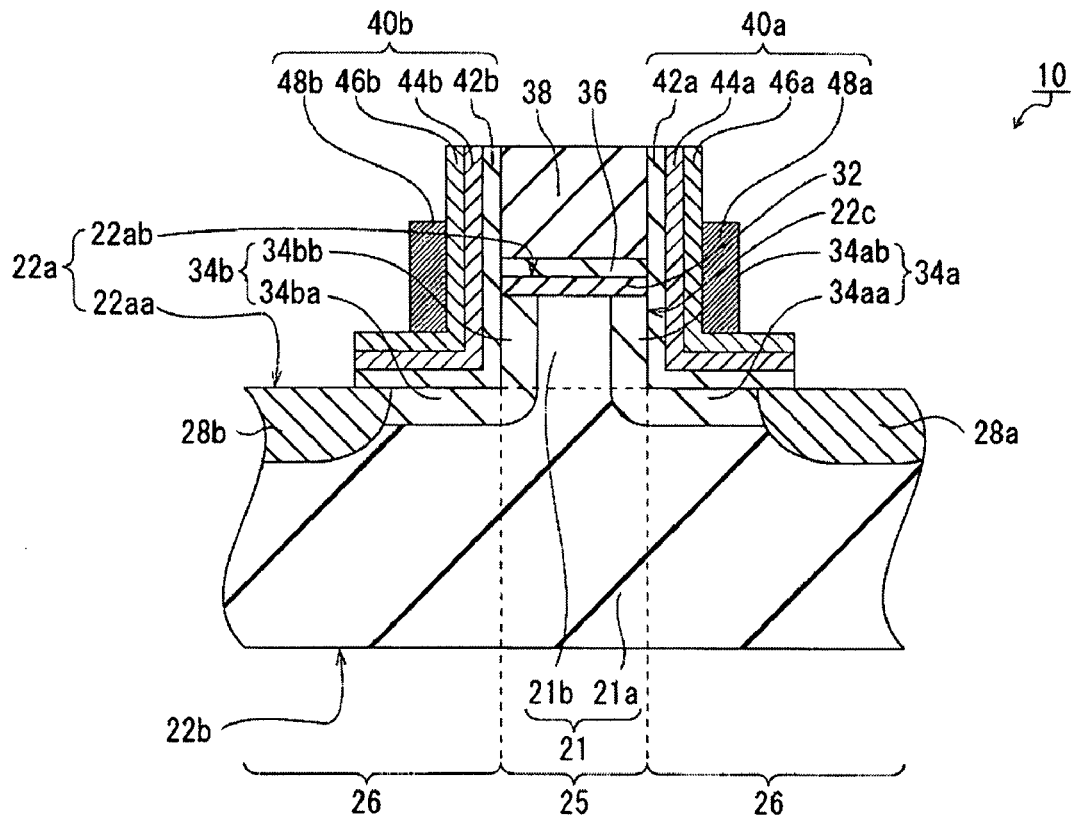
FIG. 1B is an enlarged cross-sectional view of one of the memory cell at an area B of the semiconductor memory device illustrated in FIG. 1, taken along with line A-A' illustrated in FIG. 1A.

FIG. 1A is a partial plan view of a nonvolatile semiconductor memory having a memory cells disposed in matrix, according to a preferred embodiment, and FIG. 1B is an enlarged cross-sectional view of one of the memory cells at an area B of the semiconductor memory illustrated in FIG. 1A, taken along with line A-A' illustrated in FIG. 1A. In the preferred embodiment, a semiconductor substrate can be formed of silicon so that a silicon substrate is used in the following description.

A nonvolatile semiconductor memory 10 is explained as follows with reference to FIGS. 1A and 1B. As shown in FIGS. 1A and 1B, the silicon substrate 21 includes a plurality of isolation layers 29. Each isolation layer 29 is formed at the one of the main surface 22a of the silicon substrate 21 and is extended in a first direction, which is along the gate length direction. The isolation layers 29 are extended in parallel to each other, and are spaced at regular intervals. The isolation layers 29 are formed by the LOCOS (LOCal Oxidation of Silicon) process or the STI (Shallow Trench Isolation) process. An area where the isolation layers 29 are formed is called an isolation region 23, and the other area between the isolation regions is called an active region 24.

As shown in FIG. 1B, the nonvolatile semiconductor memory 10 in each memory cell includes MOSFET formed on the silicon substrate 21. The MOSFET includes a gate electrode 38 acting as a control electrode, and a diffusion layer 28 having a first and a second diffusion layers 28a and 28b.

The semiconductor memory 10 further includes a charge-storage multi-layer 40 having a first and a second charge-storage multi-layers 40a and 40b. The gate electrode 38 is sandwiched by the first and the second charge-storage multi-layers 40a and 40b. Since the semiconductor memory 10 in each memory cell includes two charge-storage layers for storing the electrons, which are the first and the second charge-storage multi-layers 40a and 40, two-bit information can be stored in a single memory cell. Here, the gate electrode 38 can be functioned for a word line (WL).

According to the structure of the semiconductor memory 10 of the preferred embodiment, the silicon substrate 21 includes a body member 21a and a step member 21b formed at the main surface 22a. The step member 21b is formed in a convex region 25, and a region between the convex regions 25 is called a flat region 26. The step member 21b is formed on a body member 21a, and is projected from a top surface 22aa of the flat region 26. In other words, as to the location from the another main surface 22b of the silicon substrate 21, the top surface 22ab of the convex region 25 is located higher than the top surface 22aa of the flat region 26. The step member 21b is formed by performing a trench-etching from the main surface 22a of the silicon substrate 21. In other words, the silicon substrate 21 at the flat region 26 is etched so that the top surface 22aa is lowered. A detail method of forming of the step member 21b from the silicon substrate 21 is explained later with specifically reference to FIG. 4D. The side surface 22c of the step member 21b is preferably formed perpendicular to its top surface 22ab and the top surface 22aa in the flat region 26.

A first well layer 32 in which the first conductivity type impurities are implanted in high concentration is formed at the top surface 22ab of the step member 21b. In the preferred embodiment, P-type impurity, such as Boron, is used as the first conductivity type. Thus, the first well layer 32 is the P-type highly doped diffusion layer.

The gate electrode 38 formed of poly-silicon is formed on the main surface 22a of the silicon substrate 21, more superficially, on the step member 21b via a gate oxide later 36. The gate electrode 38 may be formed of a polycide layer, which is formed of a multi-layer having a poly-silicon layer and a metal silicide layer.

A pair of the first and the second diffusion layers 28a and 28b is formed at the main surface 22a of the silicon substrate 21. The diffusion layer 28 is formed from the top surface of top surface 22aa in the flat region 26 into the body region 21a of the silicon substrate 21. The diffusion layer 28 is extended along the gate electrode 38, and is formed in the flat regions 26 of the silicon substrate 21, which are located at the both sides out of the gate length of the gate electrode 38. The diffusion layer 28 in which the second conductivity type (N-type) impurities are implanted in high concentration is formed. Thus, the first and the second diffusion layers 28a and 28b are defined as the N-type highly doped diffusion layer (N$^+$ layers). Each of the first and the second diffusion layers 28a and 28b acts as either a drain or a source at the time that the MOSFET is in operation.

Second well layers 34a (34aa and 34ab) and 34b in which the first conductivity type (P-type) impurities are implanted in light concentration is formed at the surface of the silicon substrate 21 between the first well layer 32 and one of the first and the second diffusion layers 28a and 28b. The second well layer 34a includes a first part 34ab, which is located at the side surface of the step member 21b, and a second part 34aa, which is located at the top surface 22aa of the flat region 26. The first part 34ab and the second part 34aa are connected at the bottom of the step member 21b in the convex region, and are formed simultaneously. The concentration of the impurities in the second well layers 34a and 34b is lighter than that in the first well layer 32.

The first charge-storage multi-layer 40a is formed on the side surface of the gate electrode 38, on the side surface of the step member 21b and the on the main surface of the silicon substrate 21 in the flat region. The first charge-storage multilayer 40a is L-letter shaped, and its bottom part is extended onto the first diffusion layer 28a. The first charge-storage multi-layer 40a includes a bottom oxide layer 42a, a charge-storage film 44a, a top oxide layer 46a and a floating electrode 48a, which are formed in the channel length direction in that order. Since the bottom oxide layer 42a, the charge-storage film 44a, the top oxide layer 46a are formed of silicon Oxide, silicon Nitride, and silicon Oxide, respectively, the structure of the three layers 42a, 44a, 46a is called an ONO insulating layer.

The bottom oxide layer 42a is formed with a silicon oxide layer and by a thermal oxidation process. The bottom oxide layer 42a, which is L-letter shaped, has a uniform thickness in a range between 5 nm and 10 nm, and is formed directly on the side surface of the gate electrode 38, on the side surface of the gate oxide layer 36, on the side surface of the step member 21b and the on the main surface of the silicon substrate 21 in the flat region. The bottom part of the L-letter shaped bottom oxide layer 42a is extended onto the first diffusion layer 28a. The charge-storage film 44a is formed with a silicon nitride layer and by a low pressure CVD process. The charge-storage film 44a, which is also L-letter shaped, has a uniform thickness in a range between 5 nm and 10 nm, and is formed directly on the bottom oxide layer 42a. The top oxide layer 46a is formed with a silicon oxide layer and by the low pressure CVD process. The top oxide layer 46a, which is also L-letter shaped, has a uniform thickness in a range between 2 nm and 10 nm, and is formed directly on the charge-storage film 44a. The floating electrode 48a is formed of poly-silicon in which phosphorus is doped with $3 \times 10^{20}/cm^2$, and formed directly on the tip oxide layer 46a. The floating electrode 48a, which is I-letter shaped, has a uniform thickness in a range between 10 nm and 30 nm, and is disposed in parallel to the side surface 22c of the step member 21b.

The second charge-storage multi-layer 40b has structure same as the first charge-storage multi-layer 40a. The second charge-storage multi-layer 40b is disposed across the step member 21b and the gate electrode 38 symmetrically with the first charge-storage multi-layer 40a.

Carriers injected into the charge-storage multi-layer 40 are mainly stored in the charge-storage films 44a and 44b among the ONO insulating layer. Although the charge-storage films 44a, and 44b is formed of silicon nitride in the preferred embodiment, each of them can be formed of a single insulating layer or a multi-insulating layer selected from an insulating layer group of a silicon nitride layer, an aluminum oxide layer and a hafnium oxide layer. Further, although the P-type well layers as the first and the second well layers are formed in the preferred embodiment, the first conductivity type can be the N-type and the second conductivity type can be the P-type.

Figure 2:
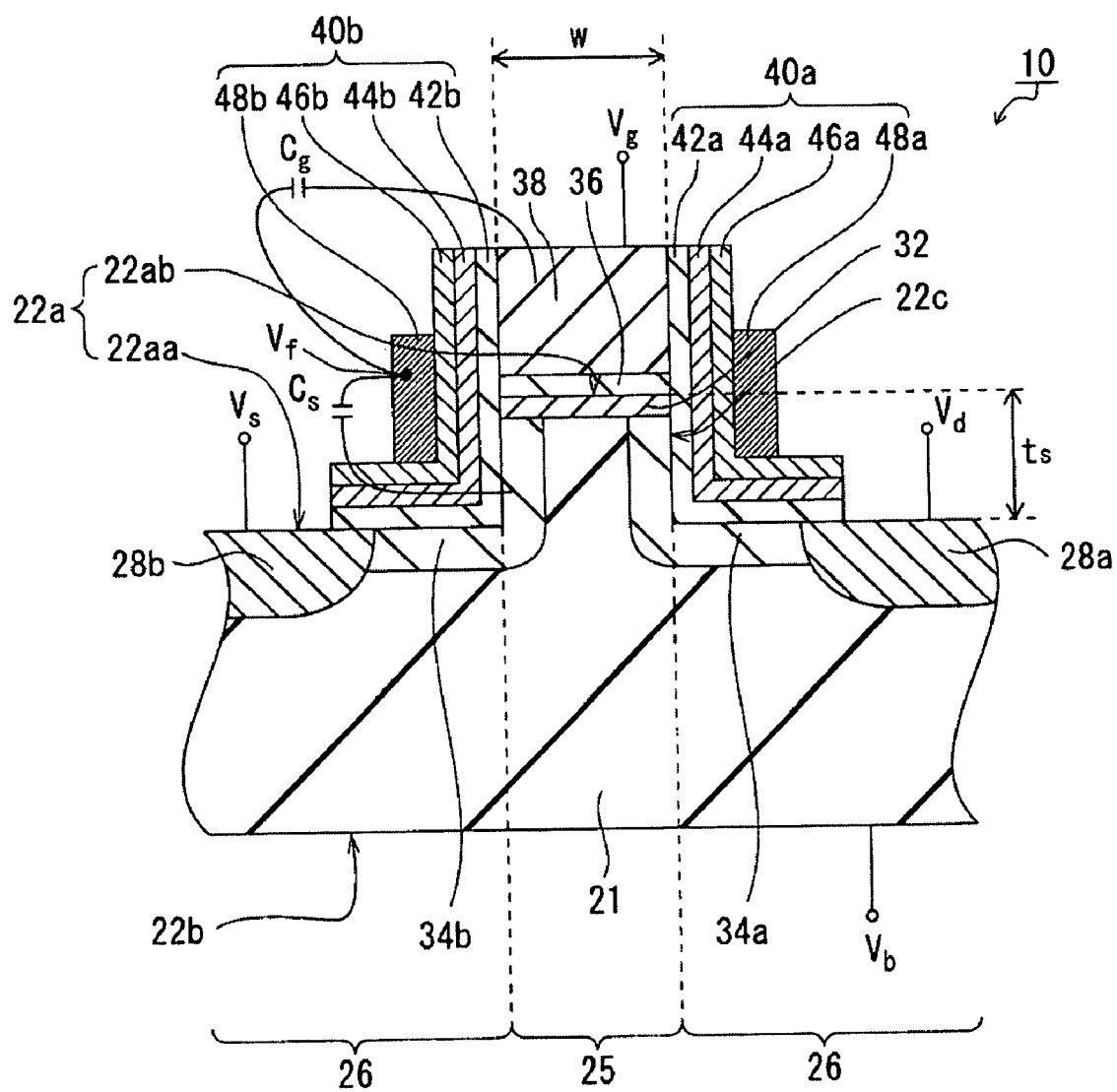
FIG. 2 is a conceptual cross-sectional view of the memory cell illustrated in FIG. 1B to explain the method of judgment as to whether or not electric charges are stored in a charge-storage multi-layer.

Next, with reference to FIG. 2, a method of judgment as to whether or not electric charges are stored in a charge-storage multi-layer is explained as follows. FIG. 2 is a conceptual cross-sectional view of the memory cell illustrated in FIG. 1B to explain the method of the judgment. In the following explanation, the case that information is read-out from the second charge-storage multi-layer 40b is explained.

As shown in FIG. 2, in order to judge the condition whether or not the electric charges are stored in a charge-storage multi-layer, the positive voltage is applied to the gate electrode 38 and to the drain 28a while the source 28b and the silicon substrate 21 are grounded. When the positive voltage is applied to the gate electrode 38, the electric potential of each floating gate 48a, 48b equals to the positive electric potential $Vf=Cg/(Cs+Cg) \times Vg$, which is generated between the control gate 38 and silicon substrate 21, because of the coupling capacitance of an electrostatic capacitance Cg between the gate electrode 38 and one of the floating electrodes 48a and 48b and an electrostatic capacitance Cs between the silicon substrate 21 and one of the floating electrodes 48a and 48b.

When no electric charges is stored in the second charge-storage multi-layer 40b, the second well layer 34b at an area adjacent to the source 28b is easily inverted by the positive electric potential Vf generated at the floating gate 48b included in the second charge-storage multi-layer 40b so that a sufficient channel current flows.

On the other hand, when the electric charges are stored in the second charge-storage multi-layer 40b, the electric field generated by the positive electric potential Vf at the floating gate 48b is terminated by the electric charges stored in the second charge-storage multi-layer 40b. As a result, the second well layer 34b at the area adjacent to the source 28b is not easily inverted. In other words, the amount of the channel current is reduced. By measuring the size of the channel current value, the condition of the memory 10 whether or not the second charge-storage multi-layer 40b stores the electric charges that is, whether the second charge-storage multi-layer 40b has data "1" or data "0", can be identified.

Here, when the electric charges are stored in the first charge-storage multi-layer 40a, the electric field generated by the positive electric potential Vf at the floating gate 48a is terminated at the first charge-storage multi-layer 40a. As a result, the second well layer 34a at an area adjacent to the first charge-storage multi-layer 40a is not easily inverted. However, a depletion layer is extended at an area in the second well layer 34a adjacent to the drain 28a. Thus, the existence/non-existence of the electric charges at the first charge-storage multi-layer 40a does not affect the amount of the channel current.

Since the memory 10 includes the first ands the second charge-storage multi-layers 40a and 40b, two-bit information can be stored by changing the function of the first diffusion layer 28a from the drain to the source, and by changing the function of the second diffusion layer 28b from the source to the drain.

The depth of the trench ts is determined by considering the ratio of the capacity coupling and the process time of the trench-etching for forming the trench.

When the thickness of each bottom oxide layer 42a, 42b, the thickness of each charge-storage film 44a, 44b and the thickness of each top oxide layer 46a, 46b are set at 5 nm, respectively, the height ts of the step member 21b is set in the range between 30 nm and 50 nm in order to secure the sufficient length of each second well layers 34a, 34b formed at each side surface 22c of the step member, which faces to one of the floating gates 48a and 48b. In other words, the height ts of the step member 21b is larger than the sum of the thickness of each bottom oxide layer 42a, 42b, the thickness of each charge-storage film 44a, 44b and the thickness of each top oxide layer 46a, 46b. While the gate length W is set at 150 nm, when the thickness of each floating gate 48a and 48b is set in the range between 10 and 30 nm, the ration $(Cg/(Cs+Cg))$ of the gate capacitance (Cg) against the total capacitance (Cs+Cg) is measured as 75%~90%. The capacitance ratio is not limited to the range described above. It is acceptable to make the capacitance ratio smaller if the threshold voltage is low, for instance that the lightly doped diffusion layers are formed as the second well layers 34a and 34b.

According to the semiconductor memory device of the preferred embodiment described above, since the floating electrodes 48a and 48b are provided in the charge-storage multi-layers 40, the electric potential of each floating electrode equals to the electric potential generated between the control gate 38 and the silicon substrate 21 because of the capacitance coupling effect by applying the voltage to the control gate 38.

The second well layers 34a and 34b, which is a lightly doped region and has the same conductivity type as the first well layer 32 formed under the control gate 38, are formed at the surface of silicon substrate 21, which faces to the charge-storage multi-layers 40. The threshold voltage of each second well layer 34a, 34b is low so that the electric potential of each floating gate 48a, 48b generated by the capacitance coupling produces a channel.

As a result, according to the semiconductor memory device of the preferred embodiment, the sufficient channel current can be flowed at the time for reading-out the information.

[Method of Manufacturing the Semiconductor Memory Device]

Figure 3A:
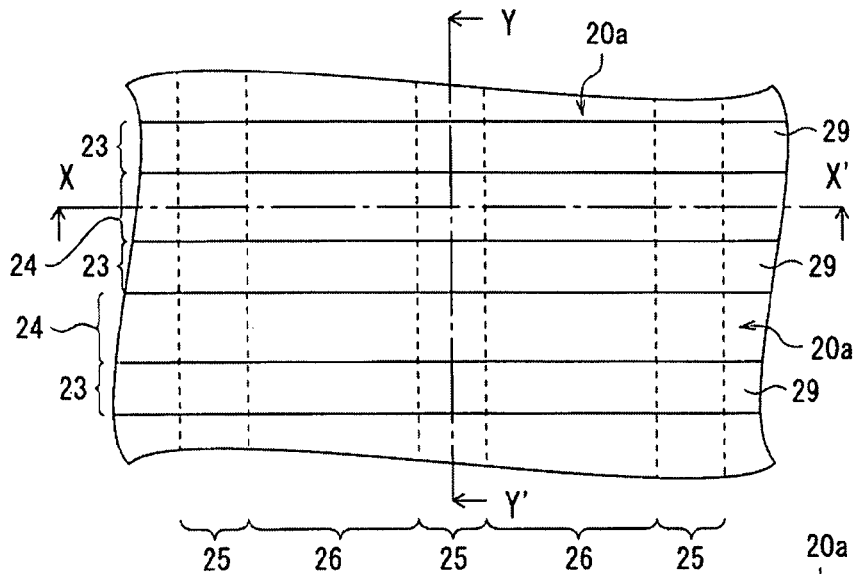
FIG. 3A is partial plan view of a silicon substrate in which isolation layers are formed.
Figure 3B:
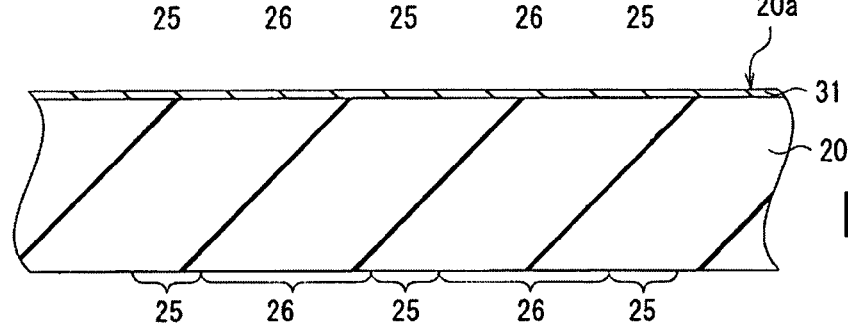
FIG. 3B is a cross-sectional view of the silicon substrate illustrated in FIG. 3A, taken along line X-X'.
Figure 3C:
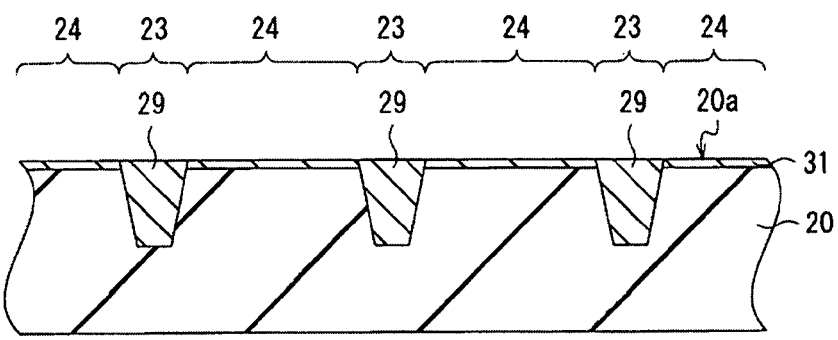
FIG. 3C is a cross-sectional view of the silicon substrate illustrated in FIG. 3A, taken along line Y-Y'.

Next, with reference to FIGS. 3A~3C and FIGS. 4A~4J, a method of manufacturing the semiconductor memory 10 illustrated in FIG. 1B is explained as follows. FIG. 3A is partial plan view of a silicon substrate in which isolation layers are formed, FIG. 3B is a cross-sectional view of the silicon substrate illustrated in FIG. 3A, taken along line X-X', and FIG. 3C is a cross-sectional view of the silicon substrate illustrated in FIG. 3A, taken along line Y-Y'. FIGS. 4A-4J are sequential cross-sectional views taken along line X-X' of FIG. 3B for manufacturing the memory 1 illustrated in FIG. 1B.

As shown in FIGS. 3A~3C, a silicon substrate 20 having a first well layer 31 in which the P-type impurities are implanted in high concentration at its main surface 20a is prepared. The isolation layers 29 are formed in the isolation regions 23 at the main surface 20a of the silicon substrate 20 by the STI process. Each active region 24 is formed between the isolation regions 23. The isolation layers 29 may be formed by the LOCOS process. Each isolation layer 29 is extended in a first direction, is disposed in parallel to each other, and is spaced at regular intervals.

Next, the convex regions 25, each of which is elongated in the second direction, are defined at the main surface 20a of the silicon substrate 20. The second direction is perpendicular to the first direction. Further, the flat regions 26, which sandwiches one of the convex regions 25, are also defined at the main surface 20a of the silicon substrate 20. Each convex region 25 is extended in parallel to each other, and is spaced at regular intervals in each of which one of the flat regions 26 is defined.

Figure 4A:
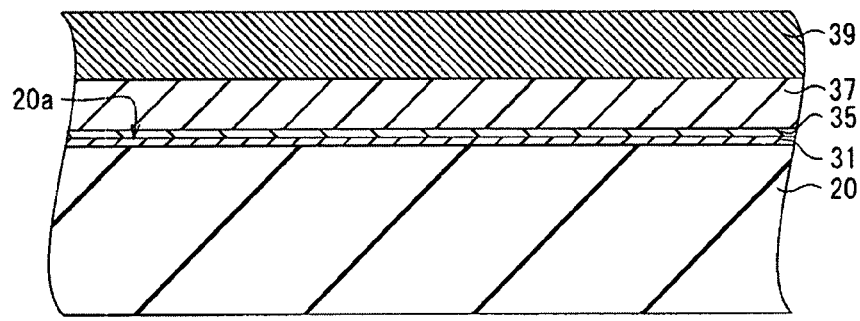
FIGS. 4A-4J are sequential cross-sectional views taken along line X-X' of FIG. 3B for manufacturing the memory 1 illustrated in FIG. 1B.

As shown in FIG. 4A, a first silicon oxide layer 35, a first conductive layer 37 and a first silicon nitride layer 39 are formed on the main surface 20a of the silicon substrate 20 in that order. The first silicon oxide layer 35 is formed by a thermal oxidation process. The first conductive layer 37 is formed by depositing poly-silicon on the first silicon oxide layer by the low pressure CVD process. Impurities are doped into the poly-silicon after or at the same time that the poly-silicon is deposited in order to obtain the conductivity. The first conductive layer 37 may be formed by a polycide structure, which is a multilayer structure of poly-silicon and metal silicide, such as tungsten silicide, formed on the poly-silicon. After that, the first silicon nitride layer 39 is formed on the first conductive layer by the low pressure CVD process.

Figure 4B:
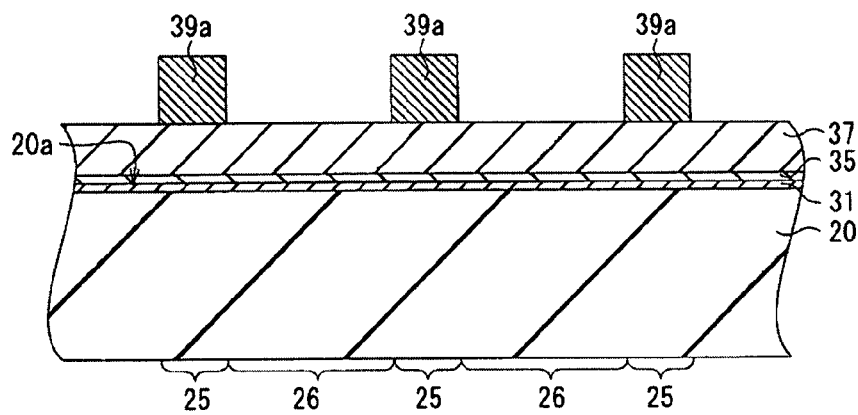

As shown in FIG. 4B, nitride layer masks 39a, each of which covers one of the convex regions 25, is formed from the first nitride silicon layer 39 by a patterning process. The patterning process is performed by the photolithography process and a dry etching process. The first nitride silicon layer 39 is partially removed in the flat region 26 by the dry etching process, and the first nitride silicon layer 39 in the convex region 25 remains as the nitride layer masks 39a.

Figure 4C:
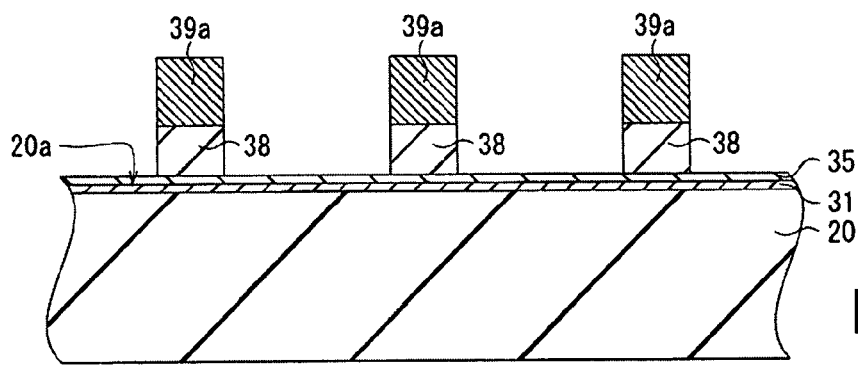

As shown in FIG. 4C, in order to form the gate electrodes 38, the dry etching process is performed to the first conductive layer 37, which is partially covered by the nitride layer masks 39a in the convex region 25. As a result of the dry etching process, the first conductive layer 37 in the flat regions 26 is removed, and the first conductive layer 37 in the convex regions 25 remains as the gate electrodes 38.

Figure 4D:
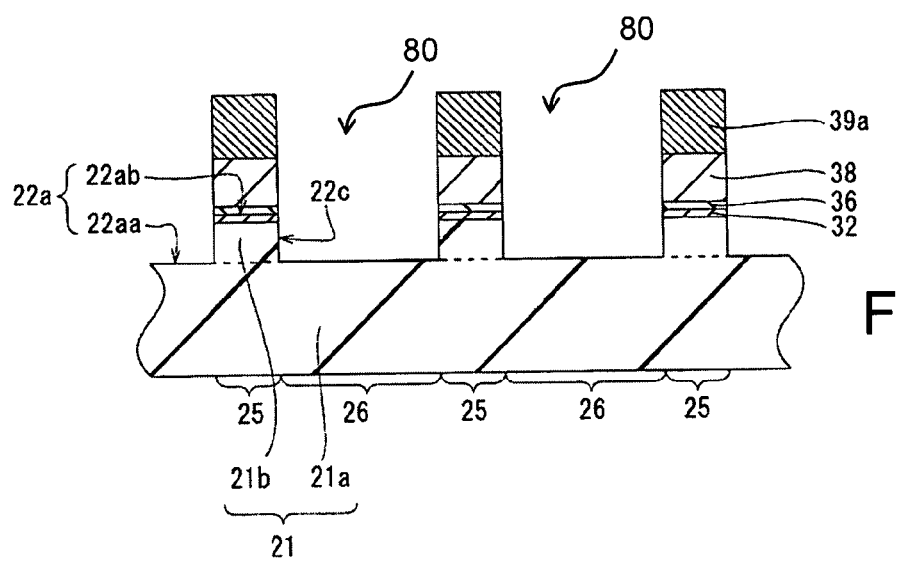

As shown in FIG. 4D, in order to obtain the patterned silicon substrate 21 having the step members 21b and the body member 21a, the patterned gate oxide layers 36, and the patterned first well layers 32, the dry etching process is performed to the first silicon oxide layer 35, the first well layer 31 and the silicon substrate 20, which are partially covered by the nitride layer masks 39a and the gate electrodes in the convex region 25. In the process of the dry etching, the first silicon oxide layer 35 and the first well layer 31 in the flat regions 26 is removed, and the main surface of the silicon substrate 20 is exposed. Here, each remaining part 36 of the first silicon oxide layer 35 in one of the convex regions 25 becomes the gate oxide layer 36.

By further performing the dry etching process, trenches 80 are formed at the main surface 22a of the silicon substrate 20. The bottom surface 22aa of each trench 80 is formed in parallel to the main surface 22ab of the silicon substrate 20. By performing the dry etching process, the patterned silicon substrate 21 having the step members 21b whose top surface is referred as 22ab and the body member 21a whose top surface is referred as 22aa is formed.

The top surface 22aa of the body member 21a in the flat region 26 is located lower than the top surface 22a6 of the step member 21b in the convex region 25. The side surface of the step member 21b is preferably formed perpendicular to the top surface 22a in the flat region 26. When the silicon substrate 20 is etched by the anisotropic dry etching, the structure described above can be established.

In the process of the dry etching, the first well layer 35 in the flat region is completely removed, and the patterned first well layer 36 remains on the top surface 22ab of the step member 21b.

Figure 4E:
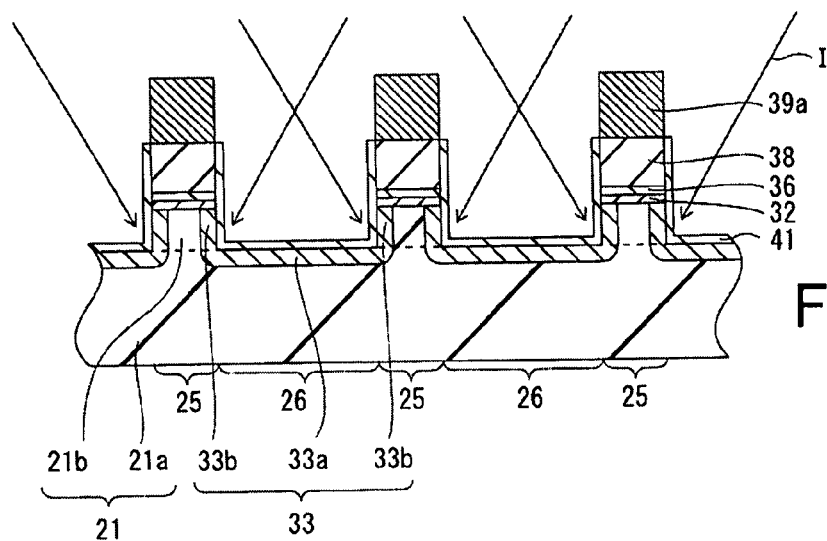

As shown in FIG. 4E, second silicon oxide layers 41 are formed on the top surfaces 22a of the body member 21a in the flat region and on the side surfaces of the step member 21b, of the gate oxide layers 36, of the first well layer 32 and of the gate electrode 38 by the thermal oxidation process. Then, P-type impurities are implanted in the silicon substrate 21 from the top surface 22aa in the flat regions 26 and from the side surfaces 22c of the step members 21b. As shown by arrows I in FIG. 4E, in order to dope the P-type impurities from the side surfaces 22c of the step members 21b, the P-type impurities are implanted from the directions, which are tilted from the axis perpendicular to the top surface 22a. By performing the implantation of the impurities, second wells 33 each having a first part 33b and second part 33a are formed, and a threshold voltage for generating a channel is set at the desired value.

Figure 4F:
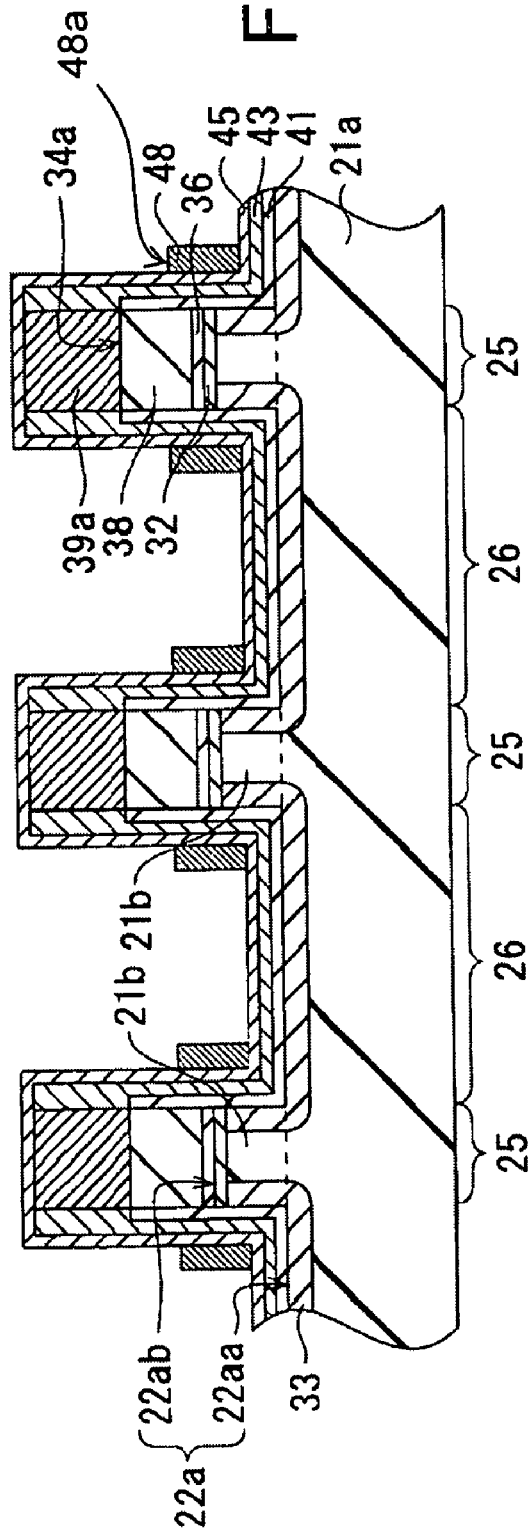

As shown in FIG. 4F, a second silicon nitride layer 43, a third silicon oxide layer 45 and a second conductive layer are formed on the second silicon oxide layer 41 in that order by the CVD process. The second conductive layer is formed by depositing poly-silicon on the third silicon oxide layer 45. Impurities are doped into the poly-silicon after or at the same time that the poly-silicon is deposited in order to obtain the conductivity.

Next, the floating gates 48 are obtained by etching the second conductive layer. Since the second conductive layer is formed on the entire surface of the third silicon oxide layer 45, some parts of the second conductive layer remain on the side surfaces of the step members 21b, of the first well layers 32, of the gate oxide layers 36 and of a lower part of the gate electrode by performing the anisotropic etching to the second conductive layer. The remaining parts of the second conductive layer become the floating electrodes 48. Here, the top surface 48a of each floating gate 48 is preferably located lower than the top surface 34a of the each gate electrode 38 in order to avoid the occurrence of the electric short between the floating gates 48 and contacts which will be formed later.

Figure 4G:
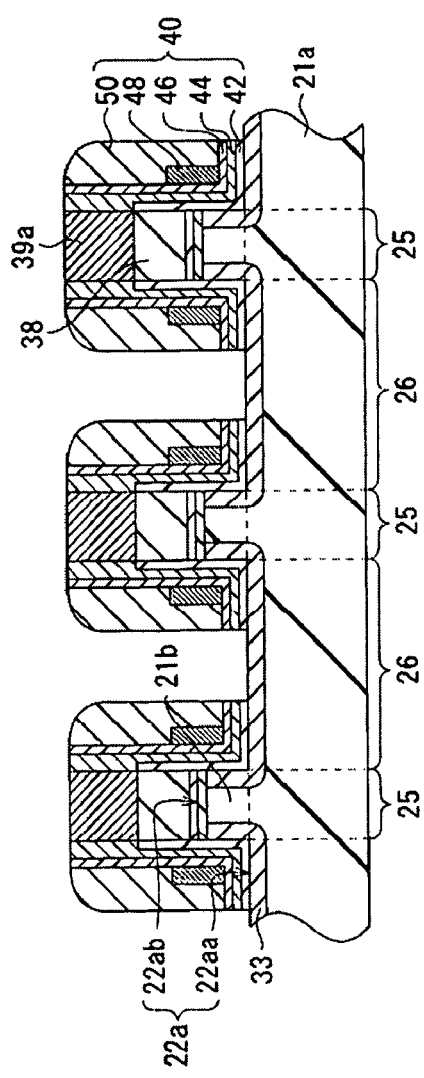

As shown in FIG. 4G, a third silicon nitride layer for covering the floating electrode 48 is formed on the third silicon oxide layer 45 by the CVD process. After forming the third silicon nitride layer, the anisotropic dry etching is performed to the entire third silicon nitride layer from the vertical direction against the main surface 22a of the silicon substrate 21. The side-wall (SW) shaped third silicon nitride layers 50 (called a SW nitride layers) remain by this anisotropic dry etching process. At the time of performing the anisotropic dry etching, the second silicon oxide layer 41, the second silicon nitride layer 43 and the third silicon oxide layer 45 formed between the SW nitride layers 50 are also removed. As a result, the top surface 22aa of the body member 21a between the SW nitride layers 50 is exposed.

The side-wall shaped charge-storage multi-layers 40 adjacent to the gate electrode, each of which includes the bottom oxide layers 42, the charge-storage films 44, the top oxide layer 46, the floating electrodes 48 and the SW nitride layers 50, are formed through the process described above.

Figure 4H:
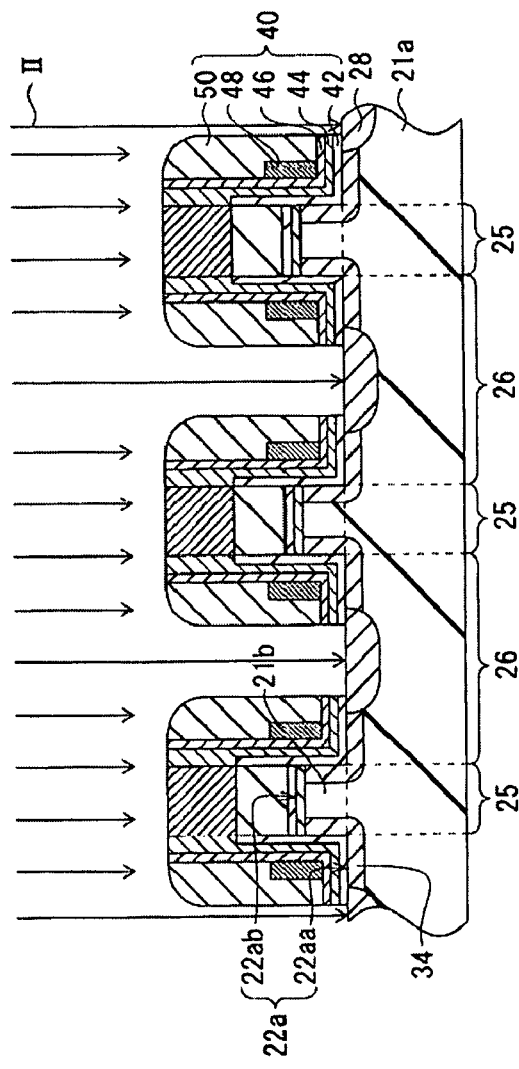

Then, as shown in FIG. 4H, the diffusion layers 28 are formed at the exposed surface 22a of the silicon substrate 21 by implanting and diffusing impurities of the second conductivity type (N type), which is different from the first conductivity type, and by the thermal treatment. For the implantation process, the nitride layer masks 39a and the side-wall shaped charge-storage multi-layers 40 are acts as the mask for the implantation, and the N-type impurities are implanted from the vertical direction against the main surface 22a of the silicon substrate 21. In the preferred embodiment, arsenic (As) is implanted with $1\times10^{15}/cm^2$, and the thermal treatment is performed for activation.

Figure 4I:
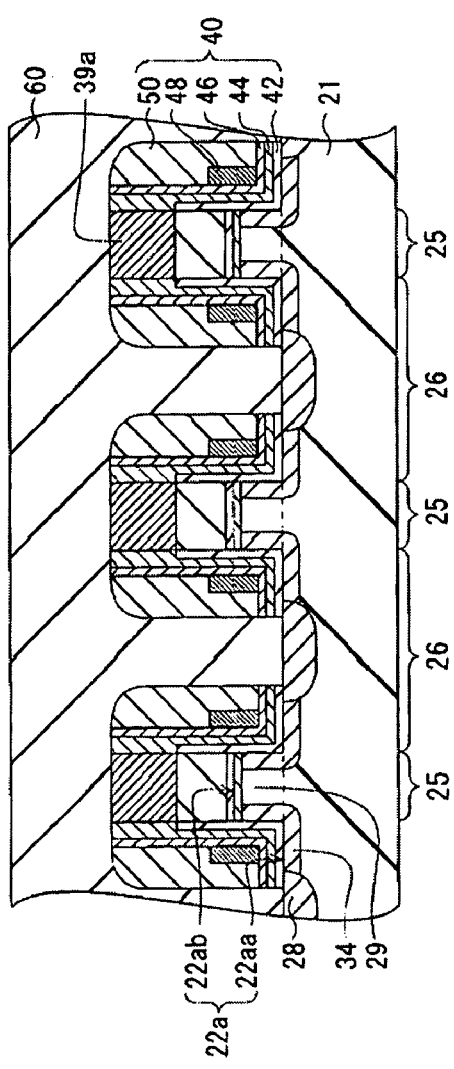

As shown in FIG. 4I, the fourth silicon oxide layer 60 is formed on the silicon substrate 21, the silicon nitride masks 39a and the charge-storage multi-layers 40, and is planarized by the CMP process. Thus, the areas between the charge-storage multi-layers 40 next to each other are buried by the fourth silicon oxide layer 60.

Figure 4J:
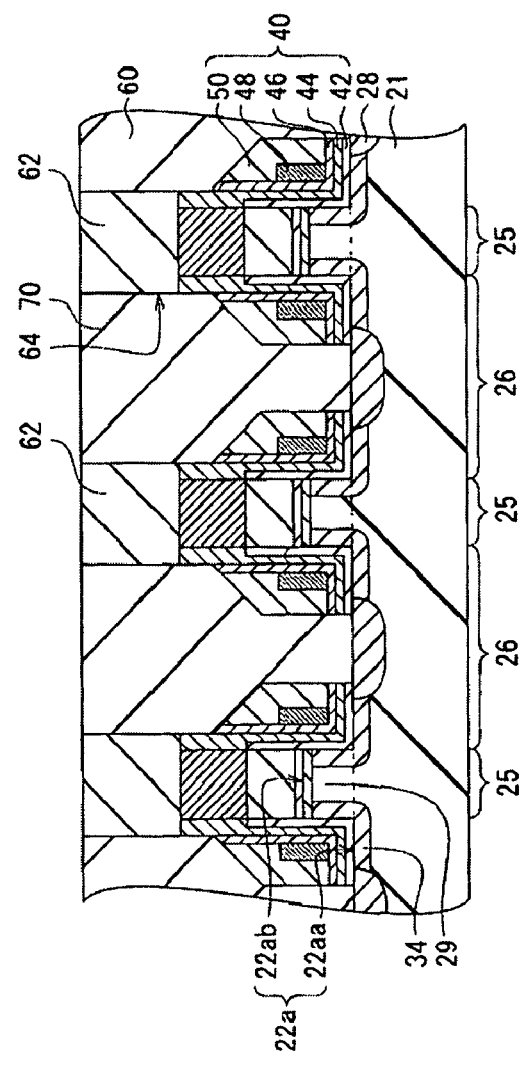
Figure 5:
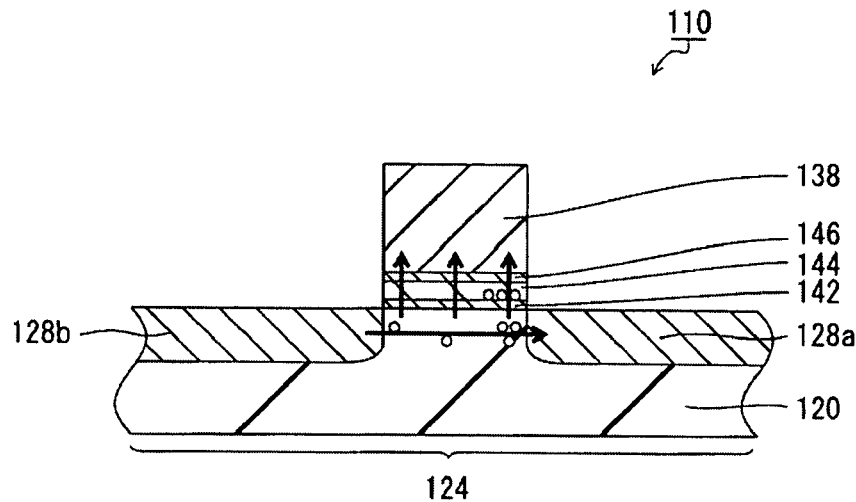
FIG. 5 is a cross-sectional view of a conventional single nonvolatile semiconductor memory cell.
Figure 6:
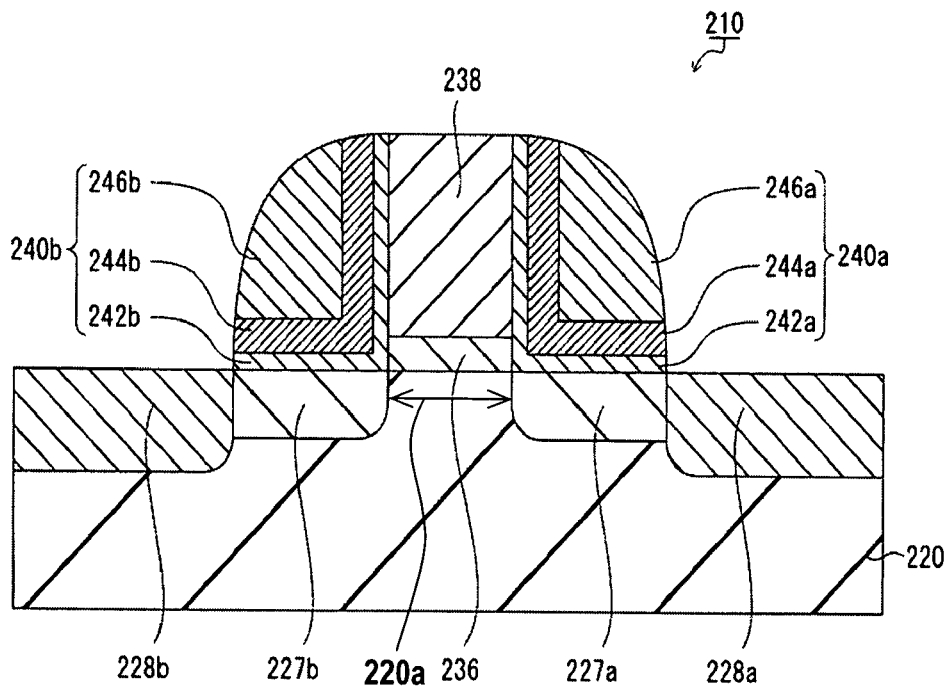
FIG. 6 is a cross-sectional view of another conventional single side-wall type semiconductor memory cell.

As shown in FIG. 4J, unillustrated resist patterns, which cover areas corresponding to the gate electrodes 38, are formed on the fourth silicon oxide layer 60 by the photolithography. A highly selective etching process under which the etching speed of a silicon oxide layer is faster than that of a silicon nitride layer is performed to the fourth silicon oxide layer 60. According to the highly selective etching process, the fourth silicon oxide layer 60 is removed other than the areas, which are cover the unillustrated resist patterns so that the self aligned contact holes 64 are formed. The remaining parts of the fourth silicon oxide layer 60 becomes an inter layers 62. After that, conductive plugs 70 formed of depositing tungsten (W) by the CVD process are buried in the contact holes 64.

Unillustrated metal wiring layers and unillustrated inter layers formed between the metal wiring layers are formed thereon by the well known process.

According to the method of manufacturing the semiconductor memory device 10, the trenches 80 are formed by removing the first well layer 31 in which the first conductive type impurities are implanted in high concentration. Thus, it is possible to easily form the second well layer 33 whose impurity concentration is lighter than that in the first well layer 31 at the surface of the silicon substrate 21 in the areas each of which faces to one of the charge-storage multi-layer 40. Furthermore, the channel can be generated by the capacitance coupling, and the sufficient length of the second well can be secured.

While the invention has been described with reference to illustrative embodiments, this description is not intended to be construed in a limiting sense. Thus, shapes, size and physical relationship of each component are roughly illustrated so the scope of the invention should not be construed to be limited to them. Further, to clarify the components of the invention, hatching is partially omitted in the cross-sectional views. Moreover, the numerical description in the embodiment described above is one of the preferred examples in the preferred embodiment so that the scope of the invention should not be construed to limit to them. For example, while the N-channel type flash memory is used in the preferred embodiment, the invention can be used to a P-channel type flash memory.

Various other modifications of the illustrated embodiment will be apparent to those skilled in the art on reference to this description. Therefore, the appended claims are intended to cover any such modifications or embodiments as fall within the true scope of the invention.

What I claim is:

1. A nonvolatile semiconductor memory, comprising:
   a semiconductor substrate having a step member formed on a main surface thereof, the step member having an upper surface;
   a first well layer of a first conductivity type, formed on the upper surface of the step member;
   a control electrode formed over the step member via a gate oxide layer, which is formed on the first well layer;
   a first diffusion layer and a second diffusion layer, each being of a second conductivity type different from the first conductivity type, the first and second diffusion layers respectively being formed on first and second areas of the substrate main surface, the first and second areas being located at opposite sides of an area where the step member is formed;
   two second well layers, each being of the first conductivity type, one of the second well layers being formed on the substrate main surface between the first diffusion layer and the first well layer, and the other second well layer being formed on the substrate main surface between the second diffusion layer and the first well layer, wherein the first conductivity type impurities in either of the two second well layers has a density that is lighter than a density of first conductivity type impurities in the first well layer, and
   a first charge-storage multi-layer and a second charge-storage multi-layer, sandwiching the step member and the control electrode, each of the first charge-storage multi-layer and the second charge-storage multi-layer including a bottom oxide layer, a charge-storage film formed on the bottom oxide layer, a top oxide layer formed on the charge-storage film and a floating electrode formed on the top oxide layer,
   wherein the step member, the first well layer, the gate oxide layer, and the control electrode are layered in this order, and
   wherein each of the second well layers is generally L-shaped in cross-section, and has an elongated segment that extends substantially parallel to the main surface of the substrate and another elongated segment that extends substantially perpendicular to the main surface of the substrate.

2. A nonvolatile semiconductor memory as claimed in claim 1, wherein a height of the step member is larger than the sum of a thickness of the bottom oxide layer, a thickness of the charge-storage film and a thickness of the top oxide layer in each of the first and the second charge-storage multi-layers.

3. A nonvolatile semiconductor memory as claimed in claim 1, wherein a height of the step member is set in a range between 30 nm and 50 nm.

4. A nonvolatile semiconductor memory as claimed in claim 1, wherein a top surface of the floating electrode in each of the first and second charge-storage multi-layers is located lower than a top surface of the control electrode.

5. A nonvolatile semiconductor memory as claimed in claim 1, wherein the bottom oxide layer, the charge-storage film and the top oxide layer in each of the first and second charge-storage multi-layers are L-letter-shaped.

6. A nonvolatile semiconductor memory as claimed in claim 5, wherein the floating electrode in each of the first and second charge-storage multi-layers are I-letter-shaped.

7. A nonvolatile semiconductor memory as claimed in claim 1, wherein the one of the second well layers is formed on one side of the step member and a third area of the main surface, the other second well layer is formed on another side of the step member and a fourth area of the main surface, the third area is between the first area and the step member, and the fourth area is between the second area and the step member.

8. A nonvolatile semiconductor memory, comprising:
a semiconductor substrate having a plurality of step members formed on a main surface thereof, the step members each having an upper surface;
a plurality of first well layers of a first conductivity type, each being formed on the upper surface of a corresponding one of the step members;
gate oxide layers formed on the first well layers;
control electrodes formed over the step members via the gate oxide layers;
a plurality of pairs of diffusion layers, each pair including a first diffusion layer and a second diffusion layer of a second conductivity type different from the first conductivity type, the first and the second diffusion layers of each pair being formed on first and second areas of the substrate main surface adjacent each step member and at opposite sides of an area where the adjacent step member is formed;
a plurality of pairs of second well layers, each being of the first conductivity type, one of the second well layers of each pair being formed on the substrate main surface between a respective one of the first diffusion layers and between a respective one of the first well layers, and the other second well layer of each pair being formed on the substrate main surface between a respective one of the second diffusion layers and the a respective one of first well layers;
a plurality of pairs of first charge-storage multi-layers and second charge-storage multi-layers, each pair sandwiching one of the step members and one of the control electrodes,
wherein a density of the first conductivity type impurities in either one of the two second well layers in each pair is lighter than a density of first conductivity type impurities in the first well layers,
wherein each of the first charge-storage multi-layers and the second charge-storage multi-layers includes a bottom oxide layer, a charge-storage film formed on the bottom oxide layer, a top oxide layer formed on the charge-storage film and a floating electrode formed on the top oxide layer,
wherein for each step member, the step member, the first well layer, the gate oxide layer, and the control electrode are layered in this order, and
wherein each of the second well layers is generally L-shaped in cross-section, and has elongated segment that extends substantially parallel to the main surface of the substrate and another elongated segment that extends substantially perpendicular to the main surface of the substrate.

9. A nonvolatile semiconductor memory as claimed in claim 8, wherein the one of the second well layers is formed on one side of each step member and on a third area of the main surface, the other second well layer is formed an opposite side of each of the step members and on a fourth area of the main surface, the third area is between the first area and each step member, and the fourth area is between the second area and each step member.

* * * * *